FIELD-EFFECT TRANSISTOR

Filed Feb. 28, 1957

INVENTOR.
JOHN TORKEL WALLMARK
BY J. L. Whittaker
ATTORNEY

United States Patent Office 2,900,531

Patented Aug. 18, 1959

2,900,531

FIELD-EFFECT TRANSISTOR

John Torkel Wallmark, Princeton, N.J., assignor to Radio Corporation of America, a corporation of Delaware Application February 28, 1957, Serial No. 643,009

17 Claims. (Cl. 307—88.5)

This invention relates to field-effect semiconductor devices of the unipolar and bipolar types. More particularly, the invention relates to unipolar and bipolar germanium transistors having control means for selectively varying the electric field adjacent the surface of a transistor device.

A desideratum in the semiconductor field is a solid-state semiconductor device that would be closely analogous to an electron tube; that is, it would be an amplifier having three or more terminals with a high input impedance, a high output impedance and a high gain. One such proposed device has been a field-effect transistor of the unipolar type. A unipolar transistor consists of a semiconductor device in which the "working current" carried by the device is carried by one type of current carrier only. In one such proposed unipolar device, the working current flows between ohmic contacts spaced at opposite ends of a semiconductor bar or wafer, the input electrode being usually designated as the "source" and the output electrode as the "drain." A region of opposite conductivity type to that of the bar constitutes a so-called "gate" which controls the flow of current between the source and drain. This gate is usually in the form of an encircling P–N junction which serves to establish a depletion region in the semiconductor bar. If the bias on the gate is made high enough at the desired polarity, the depletion region of the encircling P–N junction becomes thick enough to pinch off the channel through which the working current flows. While such devices have been proposed because of their theoretically desirable properties of providing a high input impedance and high current gain and possibly high frequency characteristics, the practical realization of such devices is difficult. Thus to achieve an effective pinch-off effect, an excessively high bias must be employed. Furthermore, if the depletion region set up reaches the opposite P–N junction, so-called "punch through" occurs and an excessively high current flows in the gating circuit.

I have discovered, however, that field effect transistors both of the unipolar type and also utilizing rectifying junctions may be satisfactorily produced by providing a control electrode adjacent a genetic layer on one or more surfaces of the semiconductor device for varying the electric field at the surface of the device. Effectively this dual layer offers selective and controllable means for varying the width of the depletion region in a unipolar device and thereby accomplishing the desired gating control. Where a bipolar device is used, i.e., where minority charge carriers are also present in addition to the majority carriers, the control electrode serves to effectively control the electron-hole recombination velocity at the surface of the semiconductor body and thereby influence the flow of carriers within the semiconductor body.

In the copending patent application of S. G. Ellis, Serial No. 426,873, filed April 30, 1954, and assigned to the assignee of this invention, there is proposed a method for reducing the surface recombination velocity of charge carriers in a germanium semiconductive material by specific chemical treatment of the surface of the material. I have discovered that by utilizing the aforesaid treatment of the surface of the semiconductor device and by providing a control electrode disposed over the treated surface and located between the source and drain electrodes in a unipolar device, the flow of majority charge carriers in the body of the semiconductor device may be selectively and controllably varied by controlling the electric field at the surface of the semiconductor device. Furthermore, by utilizing the same general structural configuration as for the unipolar device, but additionally providing for injection and collection of minority charge carriers, the flow of minority carriers within the device may be controlled.

Accordingly, one object of the instant invention is to provide an improved field-effect semiconductor device.

It is a further object to provide an improved germanium unipolar transistor device having novel means for controlling the flow of majority current carriers within the device.

It is still a further object to provide a filamentary bipolar germanium transistor device having controllable means for injecting minority charge carriers and also having means for controlling their flow through the device.

It is a feature of this invention that one or more of the surfaces of a semiconductor device disposed between the source and drain electrodes of a unipolar transistor has a genetically derived insulating layer thereon and an independently biasable control gating electrode for selectively and controllably varying the flow of majority carriers within the device.

It is an additional feature of this invention that the source and output electrodes may be made rectifying electrodes so as to inject minority charge carriers into the semiconductor device and thereby interact with majority carriers present in the device.

Other objects and features of this invention will appear more fully and clearly from the following description of illustrative embodiments thereof taken in conjunction with the appended drawing in which.

Figure 1:
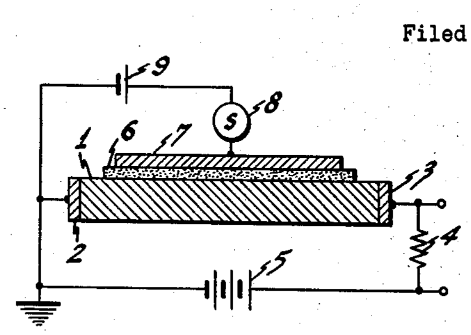
Fig. 1 is a cross-sectional elevational view of a unipolar device according to the instant invention including a schematic representation of a circuit in which this device may be used.

Referring to Fig. 1, a unipolar transistor wafer 1 is shown. For purposes of illustration, this wafer 1 is assumed to be of single crystalline N-type germanium having a preferred resistivity of approximately 10 to 20 ohm-centimeters. As is common terminology in this art, a semiconductor of the N-type refers to material containing an excess of electrons, whereas P-type material contains a deficiency of electrons. This deficiency of electrons is frequently referred to as an excess of holes or of effective positive charges. Such an N-type crystal may be obtained by growing high-purity germanium from a melt containing a predetermined quantity of an N-type conductivity-determining impurity such as antimony, phosphorus, arsenic or bismuth. Where it is desired to use P-type germanium, the semiconductor body is preferably grown from a melt containing a P-type conductivity-determining impurity such as aluminum, gallium, indium or boron. The wafer used is cut from a single crystal of N-type germanium and is preferably about .2 inch square and about .0003 inch thick. An ohmic electrode 2 is connected to one end of wafer 1 and to ground. Electrode 2 constitutes the "source" of the unipolar transistor. At the opposite end of the transistor is connected ohmic electrode 3 which is then connected to an output load 4 and to the positive terminal of a biasing source 5. The negative terminal of biasing source 5 is connected to source electrode 2. Electrode 3 constitutes the "drain" or output electrode, the output being derived across load 4. In operation of the device shown, majority carriers, which are electrons when the wafer is of N-type conductivity, flow from the source electrode 2 to the drain or output electrode 3 of the semiconductor device under the influence of the biasing source 5.

It is a feature of this invention that a dual layer is provided on the surface of the semiconductor body disposed between the source and drain electrodes in order to selectively and controllably vary the surface conductance characteristics of the semiconductor device. The layer immediately adjacent the semiconductor body is an insulating barrier layer 6 genetically derived therefrom. That is, it is a layer formed by chemical treatment of the semiconductor surface itself and not by deposition of an artificial layer thereon. Further, if a conductive control electrode 7 is disposed over the genetic insulating layer 6 and a signal or other control potential is applied to the genetic insulating layer 6 by means of control electrode 7, the flow of current between ohmic electrodes 2 and 3 may be thereby selectively controlled. Preferably the control electrode is substantially coextensive with the genetic layer on the surface of the semiconductive body and in intimate contact therewith. Thus changes in the control voltage of less than a volt provide a marked control of the current flowing between the ohmic electrodes. This is in marked contrast to the so-called brute-force methods heretofore attempted, where voltages of the order of hundreds of volts were applied in order to obtain a variation in the current flow.

An artificially deposited layer, that is, one externally deposited on the semiconductor body, and not derived from the surface by chemical treatment thereof, has been found unsuitable for the purposes of this invention; it is therefore considered essential that the insulating layer 6 on the surface of the semiconductor body be genetically derived therefrom. The thickness of this insulating barrier layer is not considered critical per se except insofar as requiring the application of a stronger control signal for a thicker layer to obtain the desired effect.

In the pending application of S. G. Ellis, hereinbefore referred to, a method is described for forming a film consisting principally of a hydrated germanium monoxide upon a germanium surface by etching the surface with a hydrofluoric acid-hydrogen peroxide solution. This surface film may be formed either before or, preferably, after the ohmic electrodes 2 and 3 have been attached to the semiconductor body. Prior to forming the germanium oxide film on the semiconductor surface, it is desirable to first etch the device in any of several known etchants in order to remove contaminating matter present on the surface. A suitable etchant comprises a solution containing 28 ml. concentrated hydrofluoric acid, 28 ml. concentrated nitric acid and 12 ml. distilled water. The device is then rinsed in distilled water and dried. Thereafter, to form the insulating barrier layer, the device is immersed in a solution comprising 40 ml. concentrated hydrofluoric acid, 6 ml. of 30% hydrogen peroxide and 24 ml. water. This solution serves to form the germanium monoxide film. The constituent portions of this solution are not critical except as to the upper limit of the hydrogen peroxide concentration. Thus the hydrogen peroxide concentration of the solution may be greatly reduced without adversely affecting the results obtained. For example, with the solution containing 40 ml. of concentrated hydrofluoric acid, as little as 16 drops of 30% hydrogen peroxide may be used, with no added water. It will be apparent that in solutions including the relatively high hydrogen peroxide concentration, the device will be immersed for a relatively short length of time, preferably not longer than two to five seconds.

The film formed by the foregoing treatment is a visible continuous, protective film upon the germanium surface of the device. The thickness of the film should be between about 10 and 5,000 angstroms, the preferred thickness being 500 angstroms. Such a layer may be built up in from five to thirty seconds. It will be appreciated that if the film is excessively thick it will have poor mechanical properties and be subject to cracking and the like, whereas too thin a layer or film may break down under an applied electric field. In general, it has been found desirable that the resistance of the genetic insulating layer between the metallic control electrode and the germanium body should exceed several megohms when a voltage of 100 millivolts is applied to the genetic layer.

Although the exact chemical composition of the film is not known, it is believed to consist principally of a hydrated form of germanium monoxide. What is considered important for the purposes of this invention is that the insulating film be a genetic one, integrally associated with the germanium surface, being genetically derived from the germanium semiconductor body by chemical treatment of the surface. As mentioned, artificially deposited insulating films have been found to be unsuitable for the purposes of this invention. It is believed that with artificially deposited insulating films a surface discontinuity is formed between the germanium semiconductor body and the deposited layer, across which the control electrode cannot establish an effective electric field. With a genetic layer, a direct continuous transition from the material constituting the semiconductor body to the layer is believed to occur, with no abrupt discontinuities existing between the surface of the semiconductor body and the genetic layer.

As mentioned, a genetically derived hydrated germanium monoxide layer is considered preferable for the purposes of this invention. Another highly satisfactory layer is a genetic germanium dioxide film formed by anodic oxidation of germanium in a solution of 0.25 normal sodium acetate in acetic acid. Other genetically derived layers are also contemplated. Thus the germanium surface may be exposed to other liquid etchants, vapors and gases in order to alter the surface characteristics thereof and form a genetically derived insulating layer. Oxidizing agents other than those described may be used, such as acidified potassium iodide in hydrogen peroxide, or bromine, or the like, or the surface may be sulfided or selenided by exposure to hydrogen sulfide or hydrogen selenide gas, respectively. In a similar manner, the surface to be treated may be exposed to the fumes of concentrated hydrofluoric acid either in lieu of the hydrogen peroxide treatment or as a supplement thereto. As mentioned, only insulating barrier layers genetically derived by chemical treatment of the surface have been found effective in the practice of this invention.

While for the purposes of this invention, it is only necessary that the genetic insulating layer be formed somewhere on the surface between the input and output electrodes, it may be simpler and more convenient to apply the genetic layer simultaneously to all the surfaces of the germanium body. This dual-sided genetic layer may be used, for example, for the embodiment shown in Fig. 1, although not illustrated therein. It will be readily apparent that where it is desired to restrict the presence of the layer to a specific area, the surface that is not to be treated may be masked with a lacquer or wax during the process of forming this insulating layer on the unmasked area.

After the barrier layer has been formed, a conductive field-establishing control electrode 7 is deposited thereover. This may conveniently be accomplished by evaporating a metal such as aluminum for example, on top of the insulating barrier layer. While this method is preferable, it is also possible, however, that an electrically conductive foil such as a thin film of aluminum or copper or the like may be placed in contact with the insulating layer. An evaporated layer is preferred because this establishes the most intimate contact between the insulating barrier layer and the conductive electrode thereby establishing an effective field at the germanium surface. If the field-establishing control electrod is remote from the germanium surface, a less effective field will be established for the same applied potential. Thus the thickness of the insulating layer may serve to determine the spacing of the field-control electrode from the germanium surface.

In operation of the device, a difference of potential may be established within the semiconductor body along its longitudinal axis by applying a voltage between the source and drain electrodes 2 and 3. If now the aluminum layer 7 is made operative as a control or gating electrode by operation of signal source 8 and associated biasing means 9, and a voltage is applied between the two end electrodes by biasing means 5, the current through the germanium bar can be readily influenced by small changes in the potential of the control electrode 7 with respect to the germanium surface. Assuming the bar to be of N-type germanium, a more negative potential on the aluminum layer will set up a field across the oxide layer 6 dragging the surface potential negative and thereby reducing the lateral conductivity in the germanium surface. Conversely, if the aluminum layer is made more positive, the field established will drag the surface potential positive increasing the lateral conductivity in the surface layer of the germanium. Where the oxide layer 6 is made relatively thin, such as approximately 100 angstroms, changes of the order of millivolts in the control potential will result in marked changes in the current flowing between the source and drain electrodes. It should be noted that at the same time as the lateral conductivity of the surface layer is changed, the surface recombination velocity also changes. Thus when the lateral conductivity increases, the surface recombination velocity decreases and vice versa. For the unipolar device, the surface recombination effect becomes relatively negligible and the change in lateral conductivity predominates inasmuch as the current is principally carried by majority carriers.

Figure 2:
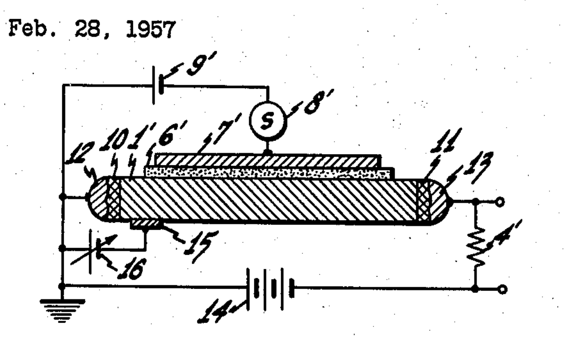
Fig. 2 is a cross-sectional elevational view of a bipolar filamentary transistor having rectifying electrodes, including a schematic representation of a circuit in which this transistor may be used.

In Fig. 2 is shown another embodiment of the fiilamentary transistor in which minority carriers are utilized for current flow through the device. In the same manner as in Fig. 1, a filamentary bar 1′ is formed, and insulating layer 6′ and control electrode 7′ are deposited thereon as hereinbefore described. However, regions 10 and 11 are of opposite conductivity type to bar 1 and form rectifying junctions with the N-type germanium. Electrodes 12 and 13 may be of indium or a suitable alloy thereof to form the P-type regions 10 and 11. These electrodes may be attached to the bar either before or after the formation of the genetic insulating layer. Where the rectifying regions are preferably first formed, then after the N-type germanium bar has been suitably etched such as in a hydrofluoric acid-nitric acid solution to expose a fresh, clean crystallographically undisturbed surface, pellets of indium are placed thereon and the ensemble is heated in an inert or reducing atmosphere for about five minutes at about 500° C. to melt the pellets and alloy them into the wafer. During this alloying process, some of the germanium dissolves in the electrode pellet. Upon cooling, it recrystallizes as part of the single crystalline structure of the germanium body. These recrystallized regions of germanium, 10 and 11, containing the P-type impurity thus become integral crystalline parts of the germanium body, forming P–N rectifying junctions therein. The pellet material attached to the rectifying junction regions 10 and 11 serve as electrodes 12 and 13 therefor. The genetic barrier layer 6′ and control electrode 7′ are then formed as hereinbefore described. Electrode 12 may be suitably biased in the conducting direction to operate as an emitter electrode by connection to the positive terminal of biasing means 14. Electrode 13 then serves as a collector electrode, being biased in the high conductivity direction by connection to the negative terminal of battery 14. Base electrode 15 and variable biasing means 16 associated therewith serve to control the rate of emitter injection.

It should be noted in the operation of this device that biasing means 14 is used to bias electrodes 12 and 13 as emitter and collector electrodes respectively, so that a certain number of minority charge carriers injected at electrode 12 reach electrode 13. Bulk-recombination effects are deliberately kept to a minimum in fabricating this device, so that the surface-recombination effect is controlling in determining the number of minority carriers reaching the collector. When signal 8′ and associated biasing means 9′ activate control electrode 7′, a greater number of minority charge carriers will be transported from electrode 12 to electrode 13. Thus, for the N-type germanium, as the control electrode 7′ is driven more positive, the electric field established drags the surface potential positive thereby markedly lowering the surface-recombination velocity. As a consequence, a greater number of minority charge carriers will reach the collector electrode. Variable biasing means 16, which may be a signal source for example, will influence the injection rate at emitter electrode 12. But, as mentioned, this additional biasing means 16 is insufficient to provide for the collection of the injected carriers, merely serving to increase the number of minority carriers injected into the semi-conductor body.

If so desired, variable biasing means 16 and signal source 8′ may each be operated as independently biased signal sources for purposes of mixing, modulation, demodulation and the like. In this respect, therefore, the specific embodiment illustrated in Fig. 2, wherein a genetic layer and a control electrode are disposed between emitter and collector electrodes at the opposite ends thereof, may be considered as representing a species of a generic concept of this invention claimed in my copending application Serial No. 643,016, filed of even date herewith and assigned to the assignee of this application.

Figure 3:
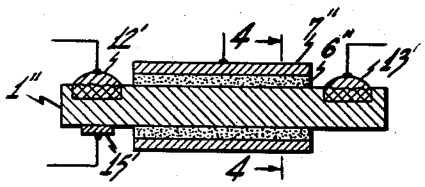
Fig. 3 is a cross-sectional elevational view of an additional embodiment of a bipolar filamentary transistor showing an alternative arrangement of the rectifying electrodes.

In Fig. 3 is illustrated a variation in the arrangement of rectifying electrodes 12′ and 13′. These electrodes operate in the same manner as described above for Fig. 2, and are also disposed at opposite ends of the insulating layer and control electrode. However, for purposes of fabrication it has been found particularly convenient to alloy the opposite-conductivity-imparting pellets into the same major face of the semiconductor bar 1″. Otherwise the operation of the device illustrated in Fig. 3 is similar to that described in Fig. 2.

Figure 4:
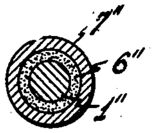
Fig. 4 is a cross-sectional view of the transistor of Fig. 3 taken along the lines 4—4 of Fig. 3.

In addition to the arrangement shown of the rectifying electrodes 12′ and 13′ on the same face of the semiconductor bar 1″, the barrier layer 6″ and the control electrode 7″ both completely encircle the semiconductor bar. This is illustrated more clearly in the view shown in Fig. 4 wherein a transverse section has been taken of the cylindrical transistor illustrated in Fig. 3. By completely surrounding the major surfaces of the semiconductor bar between the rectifying electrodes 12′ and 13′ with the genetic layer 6″ and control layer 7″, more accurate control of the flow of minority carriers may be obtained.

Figure 5:
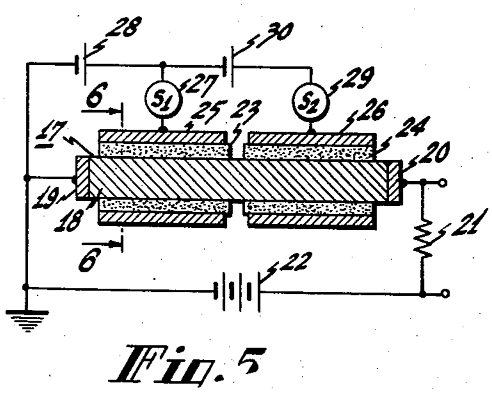
Fig. 5 is a cross-sectional elevational view of a unipolar device of this invention having a plurality of control electrodes, including a schematic representation of a circuit in which this transistor may be used.

In Fig. 5 is shown a unipolar transistor device 17 consisting of a wafer of N-type germanium 18 and source and drain electrodes 19 and 20, respectively. As shown, ohmic electrode 19 is connected to one end of wafer 18 and to ground. At the opposite end, ohmic electrode 20 is connected to output load 21, which in turn is connected to the positive terminal of biasing source 22. The negative terminal of biasing source 22 is connected to source electrode 19. In operation of this device, majority carriers, which are electrons for a wafer of N-type conductivity, flow from source electrode 19 to output electrode 20 under the influence of biasing source 22. However, this device provides two genetically derived layers 23 and 24 completely surrounding the major surfaces thereof. These genetic layers are similar to those heretofore described being preferably of germanium monoxide or germanium dioxide and derived by chemical treatment of the germanium surface. Overlying these genetic layers are control electrodes 25 and 26. It is preferred that these electrodes be substantially coextensive with the underlying genetic layers and in intimate contact therewith. Genetic layers 23 and 24 may be combined into a single, continuous layer if so desired. However, for multielectrode control, conductive layers 25 and 26 must not be in contact. These control electrodes, as hereinbefore indicated, are preferably layers of aluminum or a similar conductive material formed on the genetic layer by electrodeposition or, preferably, by vacuum evaporation, thereon. Operatively associated with control electrode 25 is first signal source 27 and biasing means 28. Similarly, operatively associated with control electrode 26 is second signal source 29 and associated biasing means 30.

Figure 6:
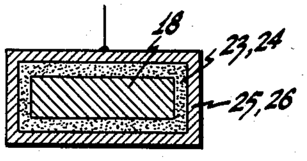
Fig. 6 is a cross-sectional view of the transistor of Fig. 5 taken along the lines 6—6 of Fig. 5.

For more effective control in the operation of this multicontrol device it is preferred that the genetic layers and the overlying control electrodes completely surround the structure so that the surface state is influenced at both major surfaces. This structural arrangement is illustrated in the cross-sectional view shown in Fig. 6 of the wafer of Fig. 5. In operation of the multicontrol device of Fig. 5, a difference of potential may be established within the semiconductor body along its longitudinal axis by applying a voltage from biasing means 22 between ohmic electrodes 19 and 20. If now aluminum layer 25 is made operative as a control electrode by operation of signal source 27 and associated biasing means 28, a voltage having been applied between the end electrodes by biasing means 22, the current through the germanium bar can be readily influenced by small changes in the potential of control electrode 25 with respect to the germanium surface. At the same time during the passage of majority carriers from source electrode 19 to output electrode 20, control electrode 26 may be similarly made operative by operation of signal source 29 and associated biasing means 30. It will thus be apparent that by individual operation of signal sources 27 and 29 various semiconductor devices useful for purposes of mixing, modulation, demodulation and gating may be obtained. Because of the high input impedance of this device many circuits useful with vacuum tube devices may be equally well used herein, the output being derived across resistor 21.

It will be seen then that with the devices illustrated herein many circuit applications heretofore possible only with vacuum tubes may now be realized with semiconductor devices because of the high input impedance, high output impedance and high gains that may be feasible with the devices of this invention. It will be readily apparent to those skilled in the art of fabricating semiconductor devices that various changes may be made in the structures herein illustrated without departing from the spirit of this invention. Thus while I have described above the principles of this invention in connection with specific devices, it is to be clearly understood that the description is made only by way of example and not as a limitation to my invention as set forth in the objects thereof and the accompanying claims.

What is claimed is:

1. A semiconductor device comprising a body of semiconductive material, a pair of spaced-apart electrodes connected to said body, a source of potential for biasing said electrodes for establishing a flow of charge carriers therebetween in said semiconductor body, a genetic insulating layer covering at least a portion of a surface of said semiconductor body between said electrodes, a control electrode adjacent said genetic layer and means for biasing said control electrode for variably influencing said flow of charge carriers.

2. A semiconductor device according to claim 1 wherein said spaced-apart electrodes are connected at substantially opposite ends of said body.

3. A semiconductor device according to claim 1 wherein said semiconductive material comprises germanium of N-type conductivity.

4. A semiconductor device according to claim 3 wherein said genetic insulating layer includes a hydrated germanium oxide as a major constituent thereof.

5. A semiconductor device comprising a body of semiconductive material, a pair of spaced-apart electrodes connected to said body, a source of potential for biasing said electrodes for establishing a flow of charge carriers therebetween in said semiconductor body, a genetic insulating layer surrounding said semiconductor body between said electrodes and covering a portion of the major surfaces thereof, a control electrode adjacent and surrounding said genetic layer, and means for biasing said control electrode for variably influencing said flow of charge carriers.

6. A unipolar semiconductor device comprising a body of semiconductive material, a pair of spaced-apart electrodes in low resistance ohmic connection to said body, a source of potential for biasing said electrodes for establishing an electric field therebetween whereby majority charge carriers may flow from said one electrode to the other, a genetic insulating layer covering at least a portion of a surface of said semiconductor body between said electrodes, a control electrode adjacent said genetic layer and means for biasing said control electrode for controllably influencing said flow of current.

7. A semiconductor device comprising an elongated body of semiconductive material, a pair of spaced-apart electrodes forming rectifying junctions with said body, a source of potential for biasing one of said electrodes for collecting minority charge carriers in said semiconductor body, a genetic insulating layer covering at least a portion of a surface of said semiconductor body between said electrodes, a control electrode adjacent said genetic layer and means for biasing said control electrode for controllably determining the number of said carriers collected.

8. A semiconductor device comprising a body of semiconductive material, a pair of spaced-apart electrodes connected to said body, a source of potential for biasing said electrodes for establishing a flow of charge carriers therebetween in said semiconductor body, a genetic insulating layer covering at least a portion of a surface of said semiconductor body between said electrodes, a plurality of control electrodes adjacent said genetic layer, and variable biasing means associated with each of said control electrodes for independently influencing said flow of charge carriers.

9. A semiconductor device comprising a body of semiconductive material, a pair of spaced-apart electrodes connected to said body, a source of potential for biasing said electrodes for establishing a flow of charge carriers therebetween in said semiconductor body, a plurality of discrete genetic insulating layers covering at least portions of a surface of said semiconductor body between said electrodes, a plurality of control electrodes each adjacent one of said discrete insulating layers, and variable biasing means associated with each of said control electrodes for independently influencing said flow of charge carriers.

10. A semiconductor device comprising a body of semiconductive material, a pair of spaced-apart electrodes connected to said body, a source of potential for biasing said electrodes for establishing a flow of charge carriers therebetween in said semiconductor body, a plurality of discrete genetic insulating layers surrounding said semiconductor body between said electrodes and covering a portion of the major surfaces thereof, a plurality of control electrodes each adjacent and surrounding one of said discrete insulating layers, and variable biasing means associated with each of said control electrodes for independently influencing said flow of charge carriers.

11. A semiconductor device comprising an elongated germanium body of N-type conductivity, spaced-apart emitter and collector electrodes in operative relation therewith, means for biasing said emitter electrode for injecting minority charge carriers into said body and for biasing said collector electrode for collecting said carriers, a genetic insulating layer covering at least a portion of a surface of said semiconductor body between said electrodes, a control electrode adjacent said genetic layer and means biasing said control electrode for controllably influencing the flow of minority charge carriers from said emitter electrode to said collector electrode.

12. A unipolar semiconductor device comprising a germanium body of N-type conductivity, a pair of spaced-apart electrodes in low resistance ohmic connection to said body at opposite ends thereof, a source of potential for biasing said electrodes for establishing a flow of majority charge carriers therebetween in said semiconductor body, a genetic insulating layer including a hydrated germanium oxide as a major constituent thereof covering at least a portion of a surface of said germanium body between said electrodes, a control electrode adjacent said genetic layer consisting of a layer of aluminum deposited thereover and in intimate contact therewith, and means for biasing said control electrode for variably influencing said flow of charge carriers.

13. An alloy-junction semiconductor device comprising an elongated body of N-type germanium having spaced-apart emitter, collector and base regions in operative relation therewith, a genetic insulating layer including a hydrated germanium monoxide as a major constituent thereof covering at least a portion of a surface of said N-type germanium body between said emitter and collector electrodes, means for biasing said emitter electrode for injecting minority charge carriers into said body and for biasing said collector electrode for collecting said carriers, a second biasing means disposed between said emitter and base electrodes for controllably influencing the injection of minority charge carriers into said body, a control electrode adjacent said genetic layer, and means for biasing said control electrode for controllably influencing said flow of minority charge carriers from said emitter electrode to said collector electrode.

14. A semiconductor device according to claim 13 wherein said genetic layer covers a major portion of said surface and said control electrode consists of a layer of aluminum deposited over said genetic insulating layer substantially coextensive therewith and in intimate contact therewith.

15. A semiconductor device according to claim 13 wherein said emitter and collector electrodes are disposed at opposite ends of said semiconductor body on minor faces thereof.

16. A semiconductor device according to claim 13 wherein said emitter and collector electrodes are disposed at substantially opposite ends of said semiconductor body on a major face thereof.

17. An alloy-junction semiconductor device comprising an elongated body of N-type germanium having spaced-apart emitter, collector and base regions in operative relation therewith, a genetic insulating layer including a hydrated germanium dioxide as a major constituent thereof covering at least a portion of a surface of said N-type germanium body between said emitter and collector electrodes, means for biasing said emitter electrode for injecting minority charge carriers into said body and for biasing said collector electrode for collecting said carriers, a second biasing means disposed between said emitter and base electrodes for controllably influencing the injection of minority charge carriers into said body, a control electrode adjacent said genetic layer, and means for biasing said control electrode for controllably influencing said flow of minority charge carriers from said emitter electrode to said collector electrode.

References Cited in the file of this patent

UNITED STATES PATENTS

| | | |
|---|---|---|
| 2,697,269 | Fuller | Dec. 21, 1954 |
| 2,791,758 | Looney | May 7, 1957 |
| 2,791,759 | Brown | May 7, 1957 |
| 2,805,347 | Haynes et al. | Sept. 3, 1957 |

FOREIGN PATENTS

| | | |
|---|---|---|
| 166,887 | Australia | Feb. 9, 1956 |